US008656207B2

(12) United States Patent
Buck et al.

(10) Patent No.: US 8,656,207 B2
(45) Date of Patent: Feb. 18, 2014

(54) METHOD FOR MODELING VARIATION IN A FEEDBACK LOOP OF A PHASE-LOCKED LOOP

(75) Inventors: Nathan C. Buck, Underhill, VT (US); Brian M. Dreibelbis, Underhill, VT (US); John P. Dubuque, Jericho, VT (US); Eric A. Foreman, Fairfax, VT (US); Peter A. Habitz, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 868 days.

(21) Appl. No.: 12/638,060

(22) Filed: Dec. 15, 2009

(65) Prior Publication Data

US 2011/0140745 A1  Jun. 16, 2011

(51) Int. Cl.
*G06F 1/00* (2006.01)
*G06F 1/04* (2006.01)
*G06F 1/24* (2006.01)
*G06F 11/00* (2006.01)
*H03L 7/06* (2006.01)

(52) U.S. Cl.
USPC ............................ 713/503; 327/156; 713/500

(58) Field of Classification Search
USPC .......................................... 713/503; 327/156
See application file for complete search history.

(56) References Cited

U.S. PATENT DOCUMENTS

| 5,944,834 | A | 8/1999 | Hathaway | |
|---|---|---|---|---|
| 6,806,750 | B1 * | 10/2004 | Rasmussen et al. | 327/156 |
| 7,111,260 | B2 | 9/2006 | Visweswariah | |
| 7,117,466 | B2 | 10/2006 | Kalafala et al. | |
| 7,293,248 | B2 | 11/2007 | Chang et al. | |
| 2006/0059446 | A1 * | 3/2006 | Chen et al. | 716/6 |
| 2007/0234252 | A1 * | 10/2007 | Visweswariah et al. | 716/6 |
| 2008/0150588 | A1 * | 6/2008 | Lin | 327/12 |
| 2008/0191746 | A1 * | 8/2008 | Friedman et al. | 327/5 |

* cited by examiner

*Primary Examiner* — Paul Yanchus, III
*Assistant Examiner* — Brandon Kinsey
(74) *Attorney, Agent, or Firm* — Schmeiser, Olsen & Watts; Richard Kotulak

(57) ABSTRACT

A method performs statistical static timing analysis of a network that includes a phase-locked loop and a feedback path. The feedback path comprises a set of delays operatively connected from the output of the phase-locked loop back to the input of the phase-locked loop. One embodiment herein computes a statistical feedback path delay for the feedback path. The method can use a separate statistical parameter to represent random uncorrelated delay variation for each delay in the feedback path. The method also computes an output arrival time for the phase-locked loop based on the negative of the statistical feedback path delay.

18 Claims, 5 Drawing Sheets

METHOD FOR MODELING VARIATION IN A FEEDBACK LOOP OF A PHASE-LOCKED LOOP

BACKGROUND

The embodiments of the invention generally relate to methods of performing statistical static timing analysis of a network including a phase-locked loop and a feedback path comprising a set of delays.

Static timing analysis operates on a timing graph at whose nodes are computed arrival times and required arrival times and on whose edges are computed delays (other quantities, such as slews, are also computed).

SUMMARY

Disclosed herein are methods of performing statistical static timing analysis of a network that includes a phase-locked loop (PLL) and a feedback path. The feedback path includes a set of delays operatively connected from the output of the phase-locked loop back to the input of the phase-locked loop. One embodiment herein computes a statistical feedback path delay for the feedback path. The method can use a separate statistical parameter to represent random uncorrelated delay variation for each delay in the feedback path. The method also computes an output arrival time for the phase-locked loop based on the negative of the statistical feedback path delay.

The process of computing the statistical feedback path delay computes a phase-locked loop sensitivity parameter that represents variation of the sum of the set of delays. The process of computing the phase-locked loop sensitivity parameter can also compute variation in internal delay of the phase-locked loop.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF EMBODIMENTS

Figure 1:
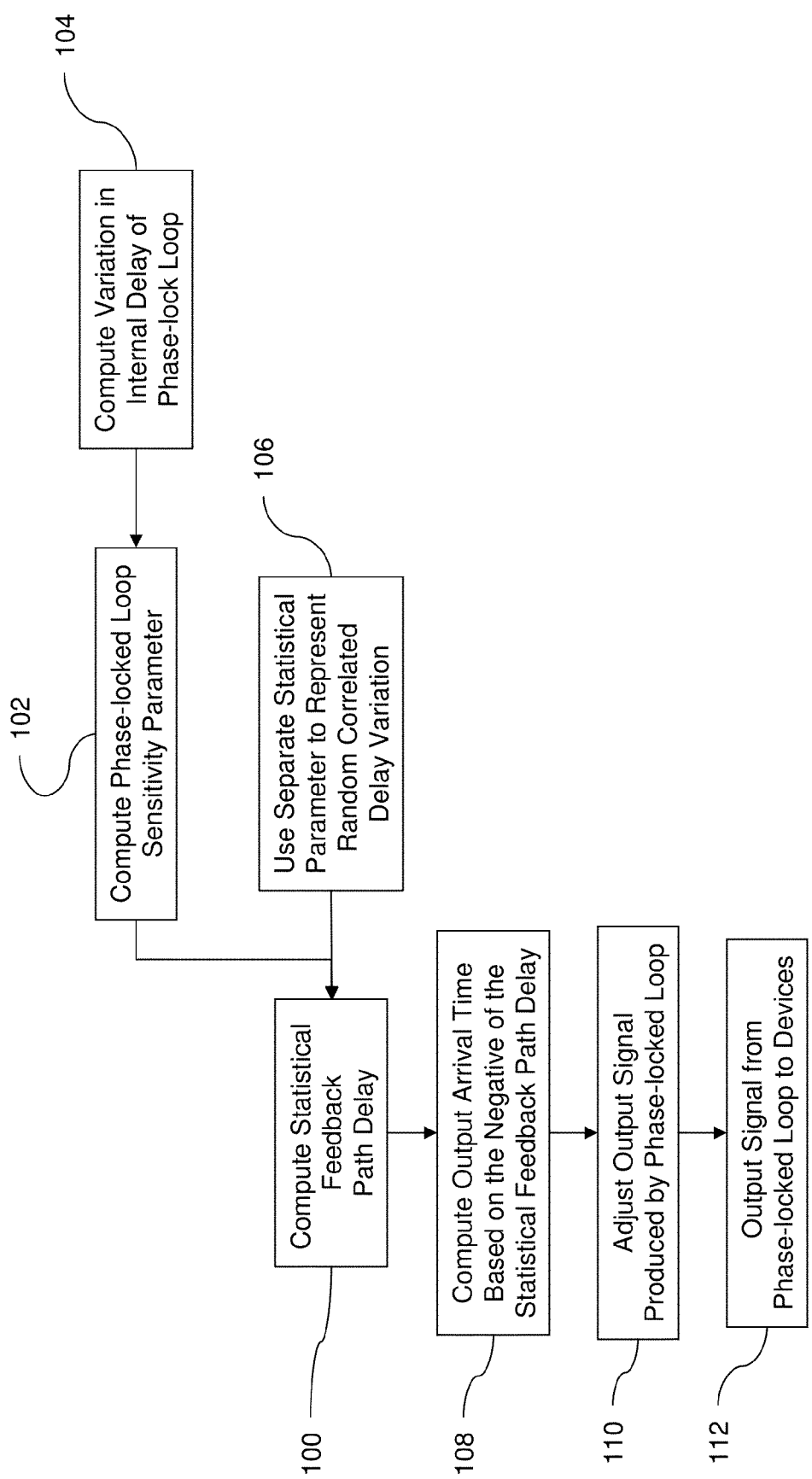
FIG. 1 is a flow diagram illustrating a method embodiment of the invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, static timing analysis (STA) operates on a timing graph at whose nodes are computed arrival times (ATs) and required arrival times (RATs) and on whose edges are computed delays (other quantities, such as slews, are also computed). Generally both early and late arrival times and required arrival times are computed for nodes. The arrival time value of a node is computed by summing delays of incoming delay edges with the arrival times of their source nodes, and taking the minimum or maximum (min or max) over all incoming edges, depending on whether an early or late arrival time is being computed. Required arrival times are similarly computed by subtracting edge delays from their sink node required arrival times, and then taking mins or maxes.

In deterministic STA, delays are represented as min/max scalar values (simple numbers), and arrival times and required arrival times are represented as scalars. In statistical STA (SSTA), however, timing quantities, including delays, arrival times, required arrival times, are represented as functions of random variables, or parameters. Although general functional forms are possible, the most common, which will be assumed here, is a first order linear model, where the contribution to delay $D_i$ of parameter $p_j$ is $D_{ij}*p_j$, and $$D_i = D_{i0} + D_{i1}*p_{i1} + D_{i2}*p_{i2} \ldots$$

It is also common to normalize all parameters to have zero mean and unit standard deviation, so that the delay sensitivity parameter $D_{ij}$ is the variation in delay $D_i$ per standard deviation of parameter $p_j$, and this will also be assumed below.

Taking sums or differences of statistical timing quantities involves computing new sensitivity values from the sensitivity values for the quantities being summed or differenced. There are generally three different types of parameters which are treated differently in statistical sums or differences, and these treatments will be described below for an example addition $AT_i + D_j \Rightarrow AT_k$.

Global parameters ($p_1 \ldots p_N$) represent variation of a quantity that may affect multiple delay edges. These sensitivities are simply summed or subtracted, so for parameter x, $AT_{kx} = AT_{ix} + D_{ix}$.

Uncorrelated random (pr) parameters represent variation unique to a particular delay edge. These must be root sum squared (RSSed) when adding quantities, so $AT_{kr} = RSS(AT_{ir}, D_{ir})$ Systematic variation parameters (ps) are those whose correlations are unknown. An example is spatial variation, in cases where it is not being explicitly modeled with location-dependent global parameters. Because these may not be correlated one cannot allow cancelation of ps variation in different delays being summed, and because they may be correlated one cannot RSS them. They are typically handled by combining them with the mean delay value (e.g., $D_{i0}$), resulting in separate early and late mode mean delay values, so that, assuming a k sigma design, $D_{i0\_min} = D_{i0} - 3*abs(D_s)$, and Di0_max=Di0+3*abs(Ds). Thus in the example case, ATk0_max=ATi0_max+Di0+3*abs(Ds), and ATk0_min=ATi0_min+Di0−3*abs(Ds). The traditional method of handling delay variation within a chip using minimum and maximum values for each delay can be considered equivalent to statistical timing using only systematic variation parameters, where the D_min and D_max values are provided directly by the delay model (i.e., Ds is never separated out).

Figure 2:
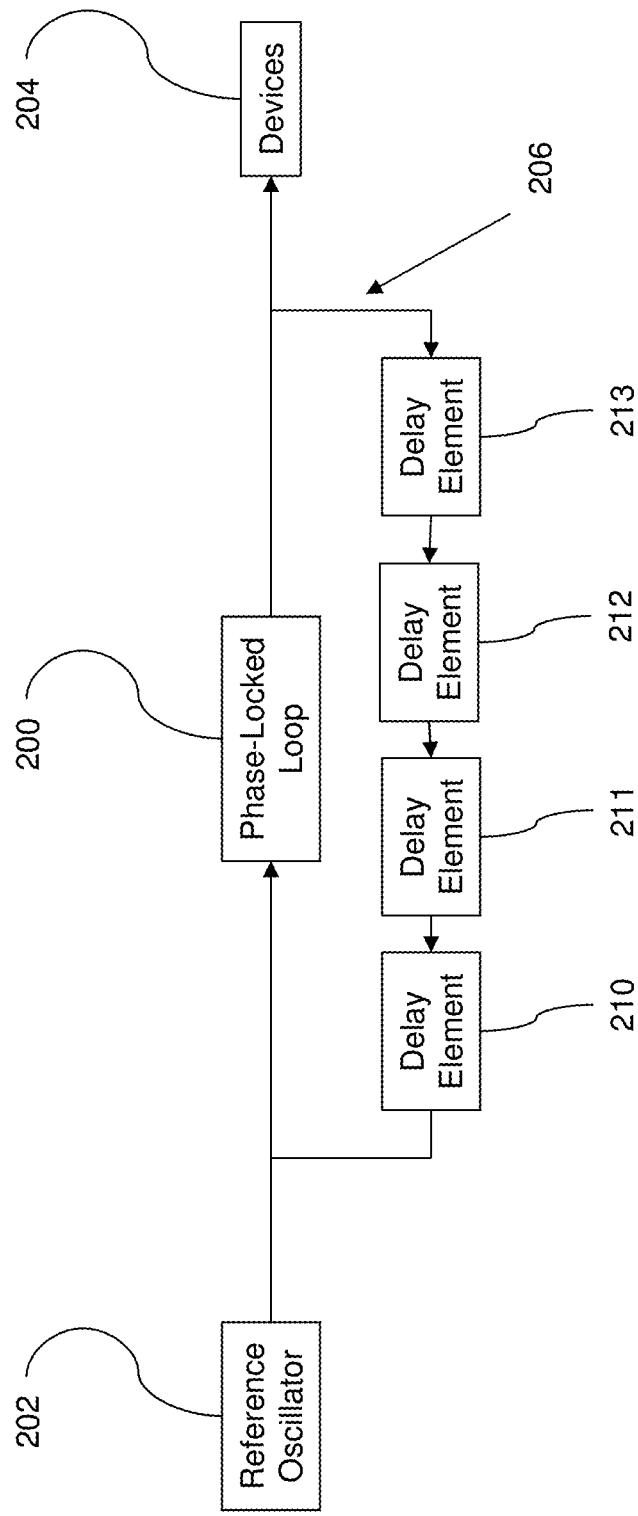
FIG. 2 is a schematic diagram of a network having a phase-locked loop.

As shown in flowchart form in FIG. 1, one method herein performs statistical static timing analysis of a network, for example, the network illustrated in FIG. 2. The network shown in FIG. 2 includes a phase-locked loop 200 and a feedback path 206. The feedback path 206 comprises a set of delays 210-213 operatively connected from the output of the phase-locked loop 200 back to the input of the phase-locked loop 200. In addition FIG. 2 illustrates a reference oscillator 202 that will supply a reference signal to the phase-locked loop 200 and also illustrates the various devices 204 that will receive the output from the phase-locked loop 200. Such systems are well known to those ordinarily skilled in the art and, therefore, a detailed discussion of the same is not included herein.

Thus, as shown in FIG. 2, a phase-locked loop 200 has, as inputs, a reference clock from the reference oscillator 202 and a feedback clock, the latter being fed from the phase-locked loop output by the feedback path 206. Again, the feedback path 206 can be a simple series of delay elements 210-213, which is a particular path through the clock distribution network (e.g., clock tree). Clocked elements (e.g., flip-flops) will be fed by outputs of the clock distribution network, via delay paths which may share some of the delay elements in the feedback path. The phase-locked loop purpose is to "cancel out" the feedback path delay (FBD) by adjusting the output arrival time of the phase-locked loop until the reference clock and feedback clock input times are the same.

Although the phase-locked loop output clock will have both a rising and falling edge, arrival times of only one edge (typically the rising edge) are compared at the reference and feedback clock inputs, so both the rising and falling output clock can be considered to be "launched" from the rising input reference clock edge, and FBD is always a rise to rise delay. The pulse width of the phase-locked loop output is generally 50%. The effective delay from phase-locked loop reference clock input rise to output clock rise is negative FBD, and the effective delay from phase-locked loop phase-locked loop reference clock input rise to output clock fall is (clock_period/2) (−FBD). This effective delay may be treated as an actual delay by the timing analyzer (adding in any internal phase-locked loop delay component), or, for timing analyzers incapable of such modeling, as an arrival time "adjust" value at the phase-locked loop output.

Referring again to FIG. 1, one embodiment herein computes a statistical feedback path delay for the feedback path, in item 100. The method also computes an output arrival time for the phase-locked loop based on the negative of the statistical feedback path delay (−FBD) in item 108. This allows the method to adjust the output signal that is produced by the phase-locked loop, as shown in item 110. After such adjustments, the adjusted signal can be output from the phase-locked loop 200 to the devices 204, as shown by item 112 in FIG. 1.

The phase-locked loop thus compensates for delay in the feedback path. The delay in the external feedback path changes due to parametric variation. In traditional deterministic static timing analysis, the phase-locked loop adjustment must be recalculated in the same corner as the worst corner identified for a given test. This recalculation has conventionally been done as a post processing step after the worst corner determination has been made based on an initial phase-locked loop calculation from a different corner.

This scope of tests affected by the embodiments herein are tests between an off chip signal and a phase-locked loop controlled signal, tests between signals sent off chip by phase-locked loop, interacting phase-locked loop domains, and phase-locked loop domains versus non phase-locked loop domains.

The process of computing the statistical feedback path delay computes a phase-locked loop sensitivity parameter that represents variation of the sum of the set of delays, as shown in item 102. More specifically, in order to calculate this phase-locked loop sensitivity parameter in item 102, this process first creates a unique parameter for each external feedback phase-locked loop. The valid parameters values can be late and early. The starting corner value for each phase-locked loop parameter determines the choice of the early or late delays to use for the feedback path delay segments. Early parameter values dictate the use of the late delay, while late parameter values dictate the use of early delay.

The process marks the delay segments in the feedback path. For each of the delay segments in the feedback path, the method calculates the delay variation due to across chip variation; expresses the delay variation as the delta delay divided by 6 sigma for each cell; and adds the parameter to the delay model. The means of the late and early delay distributions are set to be equal and delay variation is captured by the PLL sensitivity parameter.

Thus, with embodiments herein, parametric variation in the external feedback path is captured as part of the characterized statistical delay model. The variation that is applied at the output of the phase-locked loop to reflect variation in the feedback path is the sum of the parametric variation of each individual cell or delay element 210-213 in the feedback path.

The variation is applied such that the variation at the output of the phase-locked loop behaves with an inverse relationship to the variation in the feedback path. Benefits include eliminating PLL VAT Correction (PVC) analysis, eliminating multiple corner runs to determine min/max feedback path delay, and eliminating matching phase-locked loop adjustment with the worst corner for a test.

A common way of characterizing a delay sensitivity to a parameter for inclusion in a delay rule is to determine a delay at extreme values (e.g., +/−3 sigma) of the parameter and divide the delay difference between the extremes by the sigma difference (e.g., 3−(−3)=6). Characterization due to unspecified sources of variation can be in the form of random or systematic delay sensitivities.

On-chip variation (OCV) such as variations of devices and interconnections in a chip is traditionally modeled in static timing analysis using independent early and late delay models. OCV modeled via different early/late (E/L) mean values is shown below using variables I, S, and R, which represent Intrinsic, Systematic, and Random delay components respectively.

$$L = I + S + R$$

$$E = I - S - R$$

Block based statistical timing analysis also uses independent early and late delay models when OCV is not modeled as an independent source of variation. Typically, the magnitude of the delay variation is consistent between the early and late delay model for a single path, but the mean values may be different and the difference represents the OCV variation.

Independent early and late statistical delay models used in traditional statistical static timing analysis (SSTA) lead to inherent slack pessimism when phase-locked loops with external feedback are included in the statistical static timing analysis. In a corner based timing methodology, late and early phase-locked loop are modeled in separate timing runs. When separate runs are performed for early and late phase-locked loop timing, it is appropriate to fix the delays in the feedback path to be consistent with the delays used to perform the phase-locked loop adjust calculation. However, when analyzing the effects of both early and late phase-locked loop in a single timing run, it is no longer appropriate to fix the delays in the feedback path.

Therefore, the embodiments herein provide a method for capturing the OCV variation in the feedback path and applying this variation as a new statistical parameter to the statistical delay model. In addition to this new parameter, a consistent delay model is used for propagating both early and late delays through the feedback path. Thus, one advantage of the embodiments herein is that the slacks, when calculated for either an early or late phase-locked loop condition, will not include any pessimism which results from any inconsistency in feedback path delays used to calculate the phase-locked loop adjust and delays used to determine arrival times at sink nodes of the clock tree which include feedback path circuits.

Thus, the embodiments herein present a new stat parameter to describe the OCV variation in the phase-locked loop feedback path and apply this new parameter to the same delay model for early and late (but with a different magnitude for OCV variation). The embodiments herein calculate the delay at each delay arc in the feedback path.

The magnitude of variation is related to the difference between the early and late delays for the given arc. The magnitude of variation is expressed as the change in delay divided by 6 sigma. Thus, the Magnitude of Variation=(D1−D2)/(Sig1−Sig2)=(D1−D2)/6, where D1 is the delay used in the starting corner (e.g. late phase-locked loop starting corner would use early delays), D2 is the delay used in the opposite corner.

The sign of the magnitude of variation is dependent upon the determination of the sigma scale. This disclosure uses a sigma scale that ranges from −3 to +3. The −3 sigma end of the scale represents early phase-locked loop (late delays) while the +3 sigma end of the scale represents late phase-locked loop (early delays). This sigma scale definition is consistent with the concept of parameter values (PLL adjust) increasing as the sigma value increases.

Given this definition of early and late and a late starting corner, then D1, which comes from early delays, would be smaller than D2, which is derived from late delays. This results in the numerator of the magnitude of variation being negative. Sigma 1 would be +3, sigma 2 would be −3. The resulting denominator will be positive. Thus the sign of the magnitude of variation would be negative.

Further, the embodiments herein capture unique OCV variation at each fanout point of the feedback path. This is accomplished by calculating a magnitude of delay variation for each delay arc in the feedback path.

The process of computing the phase-locked loop sensitivity parameter can also incorporate variation in internal delay of the phase-locked loop, as shown in item 104. This disclosure provides that delay variation that may not be specified in a delay rule, but may be known by other means (e.g., specified as delay bounds in a databook) and may incorporated into a delay model. In particular, if the +/−3 sigma delay bounds (given fixed values of all parameters that are already modeled in the delay rule) are Dmin to Dmax, a new parameter may be introduced in the delay model whose sensitivity per sigma is (Dmax−Dmin)/6. Because phase-locked loop delay variation (jitter, etc.) is often given in a databook but not modeled in a delay rule, the inventors included it in this group.

More specifically, in order to compute variation in internal delay of the phase-locked loop, as shown in item 104, this process first creates a unique parameter for each external feedback phase-locked loop. Again, the valid parameters values can be late and early. The starting corner value for each phase-locked loop parameter determines the choice of the early delays to use for the feedback path delay segments. Early parameter values dictate the use of the late delay, while late parameter values dictate the use of early delay.

The process calculates the feedback path delay variation due to across chip variation in the delay path, and expresses this delay variation as the delta delay per unit sigma. Then, this process calculates the delta delay per unit sigma for the data book tolerance for the phase-locked loop.

There will be variation both internal to the phase-locked loop (an inability to exactly meet its delay cancellation objective) and in the feed back path element delays. Because the FBD is negated to form the phase-locked loop effective delay, the largest (late mode) FBD gives the smallest (most negative) effective phase-locked loop delay, and the smallest (early mode) FBD gives the largest (least negative) effective phase-locked loop delay. So, for min and max PLL internal delays (deviations from exact feedback path cancellation) Dpll_min and Dpll_max, the PLL output ATs will be:

ATout_early=ATref_rise_early+$D$pll_min−FBD_late
(+clock_period/2 for falling out)

ATout_late=AT_ref_rise_late+$D$pll_max−FBD early(+
clock_period/2 for falling out)

Thus, the resulting statistical delay model includes two independent parameters representing variation affecting the output of the phase-locked loop. The implication of having two independent parameters is that all combinations of those parameters should be analyzed. The analysis of all combinations of the two independent parameters described above results in combinations which do not contribute to the latest and earliest values. To address this, the embodiments herein provide a method to intelligently combine these two independent parameters into a single parameter. The resulting analysis with the single parameter accurately predicts the late and early arrival times while eliminating non timing critical analysis. Thus, embodiments herein provide an intelligent combination of more than one source of independent variation (not part of a characterized delay equation) into a single parameter.

The insight to create this intelligent method of combining parameters comes from a detailed understanding of the components of variation affecting the performance of the phase-locked loop as well as the mechanics of including those sources of variation into a statistical static timing analysis adjustment at the output of the phase-locked loop. With this insight and the understanding in static timing analysis that only the performance limiting combinations of variation are sought, simplifications can be made to eliminate non-performance limiting combinations leading directly to the reduction in the number of required parameters.

CPU analysis time and memory overhead are critical machine resources that may limit the viability of statistical static timing analysis. Run time and memory are proportional to the number of sources of variation in the timing model. Run time can be reduced by combining more than one source of variation into a single parameter. Analysis must be done for each value of a parameter. By reducing the number of parameters, less overhead and resources are consumed. Each parameter requires memory resource at each relevant node in the timing graph. A reduction in the number of parameters leads directly to a reduction in the required memory resource.

As noted above, the embodiments herein create a new parameter to model the phase-locked loop output variation resulting from the OCV variation in the feedback path. This parameter can take on early and late values and it is important to appreciate the context of what the early and late parameter values represent. An early parameter value models the earliest arrival time at the output of the phase-locked loop. A late parameter value models the latest arrival time at the output of the phase-locked loop.

As discussed above, a new parameter is created to model tolerances specified for the phase-locked loop, which is sometimes provided in a databook. Examples of such tolerances are static phase error and static phase offset. This parameter can take on early and late values. An early parameter value models the earliest arrival time at the output of the phase-locked loop. A late parameter value models the latest arrival time at the output of the phase-locked loop.

In static timing analysis, the latest and earliest arrival time at each point are sought. These are two parameters affect arrival time at a single point. When looking at the effect of variation on arrival time at a single point, the primary concerns are the max and the min. Parameter value combinations which result in data points between the extremes are not critical and thus are not necessary for static timing analysis.

When parameter values are specified in normalized units, it is valid to directly combine the sensitivities. The parameters representing OCV in the feedback path and the parameter representing databook tolerance for the phase-locked loop are both expressed as units of arrival time change per unit sigma. The sensitivity of the new parameter created by combining these two will also be expressed in units of arrival time change per unit sigma and the magnitudes can be arithmetically added.

The new single parameter can have values of early and late. An early parameter value models the earliest arrival time at the output of the phase-locked loop. A late parameter value models the latest arrival time at the output of the phase-locked loop. As shown in item 106, in some embodiments, the method can combine the random uncorrelated delay variation for each delay in the feedback path into the one parameter used to model all PLL delay variations.

Figure 3:
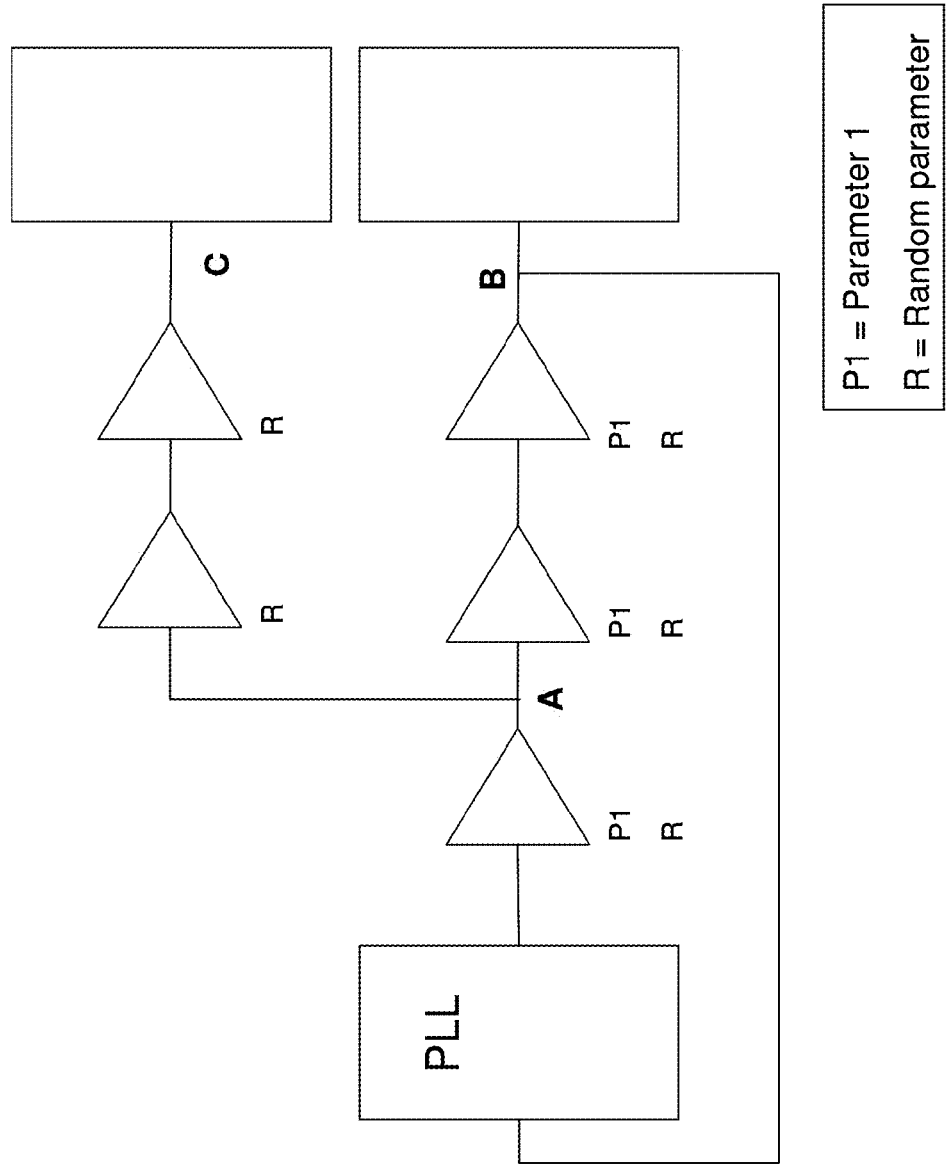
FIG. 3 is a schematic diagram of circuits in a feedback path of a phase-locked loop according to an embodiment of the invention.

The random component of delay in the feedback path of the PLL must be treated uniquely since random delays should never cancel out outside of the feedback path. At the end of the feedback path, the PLL compensates for the overall delay which includes a random component. Hence it is appropriate that the statistical delay model have no sensitivity to random variation at the end of the feedback path. However the negative of the total random component of the feedback path cannot be applied directly to the output of the PLL. As shown in FIG. 3, in the diagram R=number from the characterized delay model, if Random (R) is modeled as a separate parameter in the canonical model, it will be one in the feedback path also. When the embodiment does the pll adjust based on the delay using the canonical model in the feedback path, it will apply the random component of delay in the opposite direction at the output of the PLL with respect to the feedback pin so that the random component of delay accumulated through the feedback path is zero when the signal reaches point B. In the following example, it is assumed the random component is 1 delay unit, the pll output after applying an adjust as described in the earlier embodiment would have a R value of −3. However, if the signal branches out of the feedback path, like at point A that R value will be −2, then because each circuit in the fanout path will have an R component that will affect the R parameter. By the time the signal reaches point C, the R value will be 0. This does not accurately reflect the delay in the upper path with respect to the contribution of randomness.

Figure 4:
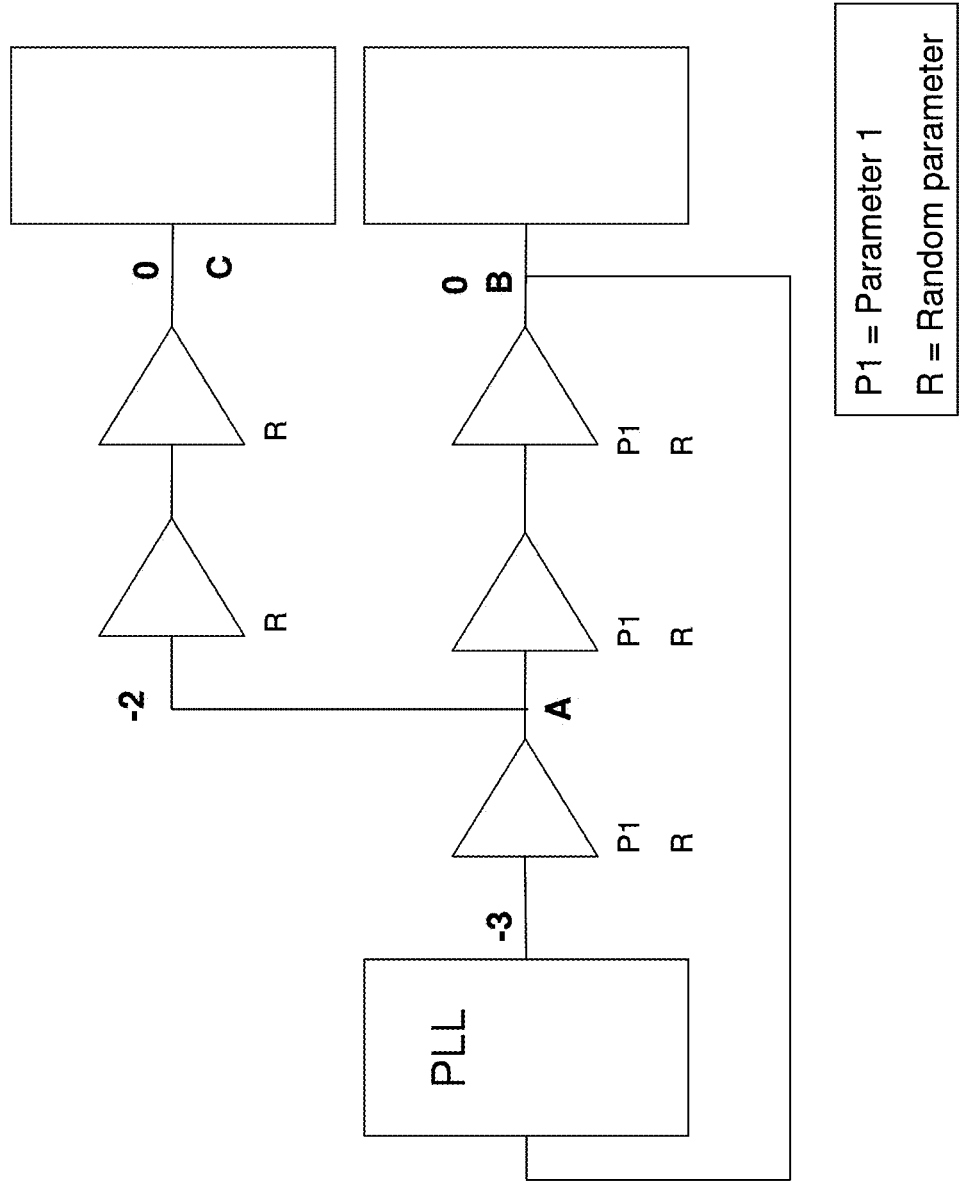
FIG. 4 is a schematic diagram of circuits in a feedback path of a phase-locked loop according to an embodiment of the invention.

As shown in FIG. 4, this invention addresses statistical delay modeling for the circuits in the feedback path of a PLL, presenting a method for the combination of the parameter representing random delay with the parameter representing ACV as detailed in patent (ACV). When the random component of delay is modeled as a separate parameter and its effect is combined into another parameter representing overall PLL variation, the sensitivity to this parameter should be zeroed out or removed from the canonical delay model for each delay arc in the feedback path.

The novelty of this invention is the method for combining the random component of delay variation with another delay variation component which is unique to the PLL feedback path. This novelty enables the separation of random delay variation in the feedback path from random delay variation in fanout paths allowing the effects of random delay in the feedback path to be entirely compensated for at the feedback pin of the PLL while making an appropriate contribution at each fanout point in the feedback path. By incorporating the Random parameter into the single P1 parameter, the effect of randomness in the feedback path can be applied as described in the earlier embodiment. As a result of this method, when the signal branches out at point A, the canonical model will appropriately incorporate the random components of the upper path. The random part of the feedback path will still be part of the canonical model, but as part of the P1 parameter. As shown in the example the contribution of random will be +2 R at point C as would be expected.

The intelligent combination of random delay component with the single PLL parameter involves an RSS treatment of random delays. The RSS'd sum of delays in the feedback path is applied to the P1 parameter at the output of the PLL. The sensitivity of the P1 parameter is modified at each node in the feedback path to remove the preceding RSS'd random components.

The embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 5:
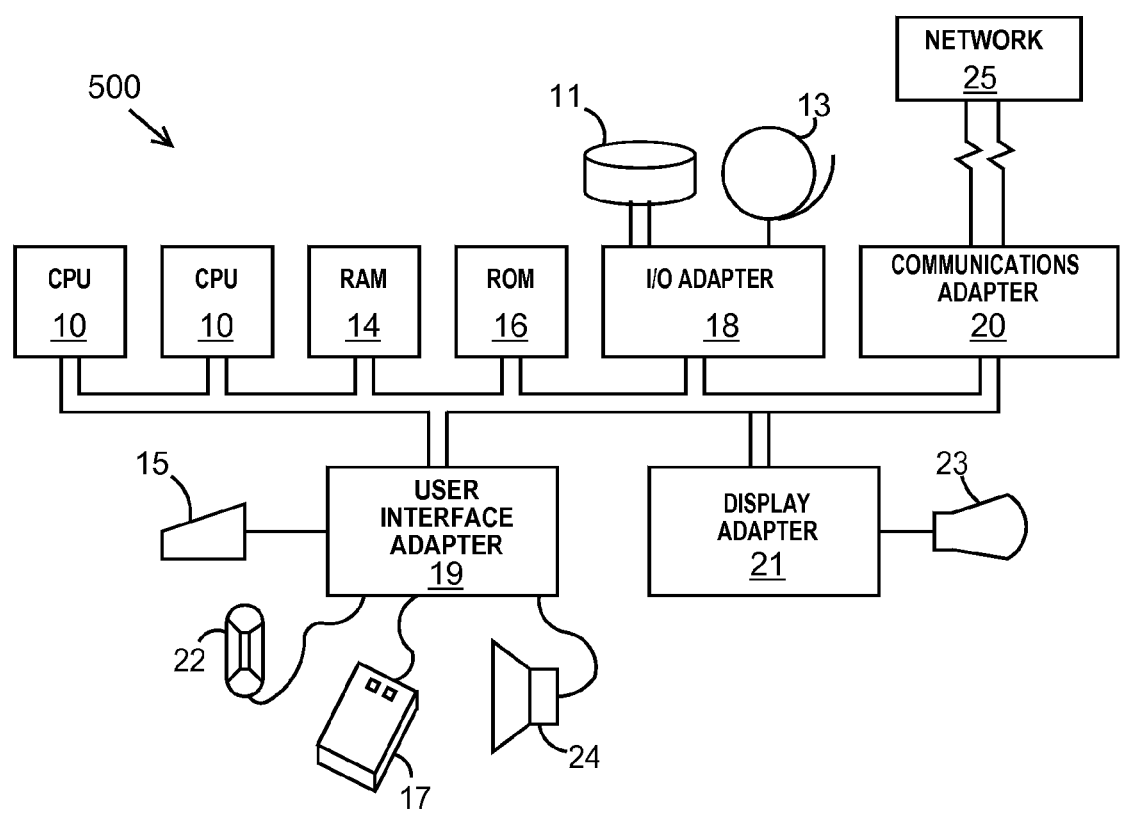
FIG. 5 is a schematic diagram illustrating an exemplary hardware environment that can be used to implement the embodiments of the invention.

A representative computer system 500 for practicing the embodiments of the invention is depicted in FIG. 5. This schematic drawing illustrates a hardware configuration of an information handling/computer system 500 in accordance with the embodiments of the invention. The system 500 comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11, tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of embodiments, those skilled in the art will recognize that the embodiments of the invention can be practiced with modification within the spirit and scope of the appended claims.

What is claimed is:

1. A method comprising:
performing statistical static timing analysis of a network, said network comprising a set of external delays serially connected between an output of said phase-locked loop and a node, said node connected to an input of a device, said node operatively connected to said phase-locked loop by a feedback path, said statistical static timing analysis comprising:
computing a statistical feedback path delay for said feedback path based on said external delays and an internal delay of said phase-locked loop;
computing an output arrival time for said phase-locked loop based on a negative of said statistical feedback path delay;
adjusting an output signal of said phase-locked loop-based upon said output arrival time to generate an adjusted output signal; and
outputting said adjusted output signal from said phase-locked loop to said device.

2. The method according to claim 1, said computing of said statistical feedback path delay comprising computing a phase-locked loop sensitivity parameter representing variation of a sum of said set of delays.

3. The method according to claim 2, said computing of said phase-locked loop sensitivity parameter comprising computing variation in said internal delay of said phase-locked loop.

4. A method comprising:
performing statistical static timing analysis of a network, said network comprising a set of external delays serially connected between an output of said phase-locked loop and a node, said node connected to an input of a device, said node operatively connected to said phase-locked loop by a feedback path, said statistical static timing analysis comprising:
computing a statistical feedback path delay for said feedback path based on said external delays and an internal delay of said phase-locked loop and using a separate statistical parameter to represent random uncorrelated delay variation for each delay in said feedback path;
computing an output arrival time for said phase-locked loop based on a negative of said statistical feedback path delay;
adjusting an output signal of said phase-locked loop-based upon said output arrival time to generate an adjusted output signal; and
outputting said adjusted output signal from said phase-locked loop to said device.

5. The method according to claim 4, said computing of said statistical feedback path delay comprising computing a phase-locked loop sensitivity parameter representing variation of a sum of said set of delays.

6. The method according to claim 5, said computing of said phase-locked loop sensitivity parameter comprising computing variation in said internal delay of said phase-locked loop.

7. A computer program product comprising a non-transitory computer useable medium including a computer readable program, wherein the computer readable program when executed on a computer causes the computer to implement a method for performing statistical static timing analysis of a network, said method comprising:

wherein said network comprises a set of external delays serially connected between an output of said phase-locked loop and a node, said node connected to an input of a device, said node operatively connected to said phase-locked loop by a feedback path, said statistical static timing analysis comprising:

computing a statistical feedback path delay for said feedback path based on said external delays and an internal delay of said phase-locked loop;

computing an output arrival time for said phase-locked loop based on a negative of said statistical feedback path delay;

adjusting an output signal of said phase-locked loop-based upon said output arrival time to generate an adjusted output signal; and outputting said adjusted output signal from said phase-locked loop to said device.

8. The computer program product according to claim 7 wherein the computing of said statistical feedback path delay comprises computing a phase-locked loop sensitivity parameter representing variation of a sum of said set of delays.

9. The computer program product according to claim 8 wherein the computing of said phase-locked loop sensitivity parameter comprises computing variation in said internal delay of said phase-locked loop.

10. A computer system, comprising:

a processor; an address/data bus coupled to said processor; and a computer-readable memory unit adapted to be coupled to said processor, said memory unit containing instructions that when executed by said processor implement a method for performing statistical static timing analysis of a network, comprising:

wherein said network comprises a set of external delays serially connected between an output of said phase-locked loop and a node, said node connected to an input of a device, said node operatively connected to said phase-locked loop by a feedback path, said statistical static timing analysis comprising:

computing a statistical feedback path delay for said feedback path based on said external delays and an internal delay of said phase-locked loop;

computing an output arrival time for said phase-locked loop based on a negative of said statistical feedback path delay;

adjusting an output signal of said phase-locked loop-based upon said output arrival time to generate an adjusted output signal; and outputting said adjusted output signal from said phase-locked loop to said device.

11. The computer system according to claim 10 wherein the computing of said statistical feedback path delay comprises computing a phase-locked loop sensitivity parameter representing variation of a sum of said set of delays.

12. The computer system according to claim 11 wherein the computing of said phase-locked loop sensitivity parameter comprises computing variation in said internal delay of said phase-locked loop.

13. The method according to claim 1, wherein said set of external delays comprise a clock tree.

14. The method according to claim 4, wherein said set of external delays comprise a clock tree.

15. The computer program product according to claim 7, wherein said set of external delays comprise a clock tree.

16. The computer system according to claim 10, wherein said set of external delays comprise a clock tree.

17. The computer program product according to claim 7, wherein said computing said statistical feedback path delay for said feedback path is computed using a separate statistical parameter to represent random uncorrelated delay variation for each delay in said feedback path.

18. The computer system according to claim 10, wherein said computing said statistical feedback path delay for said feedback path is computed using a separate statistical parameter to represent random uncorrelated delay variation for each delay in said feedback path.

* * * * *